United States Patent
Subramanian et al.

(10) Patent No.: US 9,727,249 B1
(45) Date of Patent: Aug. 8, 2017

(54) SELECTION OF AN OPEN BLOCK IN SOLID STATE STORAGE SYSTEMS WITH MULTIPLE OPEN BLOCKS

(71) Applicant: SK Hynix Inc., Gyeonggi-do (KR)

(72) Inventors: Arunkumar Subramanian, San Jose, CA (US); Zheng Wu, San Jose, CA (US); Suneel Kumar Indupuru, Cupertino, CA (US); Jason Bellorado, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 14/543,333

(22) Filed: Nov. 17, 2014

Related U.S. Application Data (60) Provisional application No. 61/936,484, filed on Feb. 6, 2014.

(51) Int. Cl.
*G06F 12/00* (2006.01)
*G06F 3/06* (2006.01)

(52) U.S. Cl.
CPC .............. *G06F 3/061* (2013.01); *G06F 3/064* (2013.01); *G06F 3/0679* (2013.01); *G06F 2212/1016* (2013.01); *G06F 2212/2022* (2013.01)

(58) Field of Classification Search
USPC .................................. 711/103, 165
See application file for complete search history.

(56) References Cited

U.S. PATENT DOCUMENTS

| | | | | |
|---|---|---|---|---|
| 2006/0161728 A1* | 7/2006 | Bennett | ............... | G06F 12/0246 711/103 |
| 2007/0245069 A1* | 10/2007 | Kikuchi | ............... | G06F 12/0246 711/103 |
| 2013/0019049 A1* | 1/2013 | Yeh | ..................... | G06F 12/0246 711/103 |
| 2013/0227236 A1* | 8/2013 | Flynn | ..................... | G11C 16/26 711/165 |

* cited by examiner

*Primary Examiner* — Mardochee Chery
(74) *Attorney, Agent, or Firm* — IP & T GROUP LLP (57) ABSTRACT

An instruction to write data to a write logical address is received where the write logical address is a member of a group of one or more logical addresses. It is determined if data associated with any of the logical addresses in the group of logical addresses has been written to any of a plurality of open groups of locations. If so, the data is written to the open group of locations to which data from the group of logical addresses has already been written to. If not, an open group of locations to write to is selected from the plurality of open groups of locations.

19 Claims, 9 Drawing Sheets

| Group | Logical Block Addresses in Group | | | | Destination Block |
|---|---|---|---|---|---|
| 1 | LBA 0 | LBA 1 | ... | LBA M-1 | {-1, 0, 1, ..., or N-1} |
| 2 | LBA M | LBA M+1 | ... | LBA 2M-1 | {-1, 0, 1, ..., or N-1} |
| 3 | LBA 2M | LBA 2M+1 | ... | LBA 3M-1 | {-1, 0, 1, ..., or N-1} |
| ⋮ | ⋮ | ⋮ | ⋮ | ⋮ | ⋮ |
| X/M | LBA X-M | LBA X-M+1 | ... | LBA X-1 | {-1, 0, 1, ..., or N-1} |

450

| Group | Logical Block Addresses in Chunk | | | | Destination Block |
|---|---|---|---|---|---|
| 1 | LBA 0 | LBA 1 | ... | LBA 7 | -1 |
| 2 | LBA 8 | LBA 9 | ... | LBA 15 | 3 |
| 3 | LBA 16 | LBA 17 | ... | LBA 23 | 1 |
| ⋮ | ⋮ | ⋮ | ⋮ | ⋮ | ⋮ |
| 8 | LBA 56 | LBA 57 | ... | LBA 63 | 1 |

SELECTION OF AN OPEN BLOCK IN SOLID STATE STORAGE SYSTEMS WITH MULTIPLE OPEN BLOCKS

CROSS REFERENCE TO OTHER APPLICATIONS

This application claims priority to U.S. Provisional Patent Application No. 61/936,484 entitled MULTIPLE OPEN BLOCKS IN NAND FLASH filed Feb. 6, 2014 which is incorporated herein by reference for all purposes.

BACKGROUND OF THE INVENTION

New solid state storage systems are being developed which further improve upon existing solid state storage systems, for example to improve the throughput and/or reduce bottlenecks in existing systems. As new systems are developed, new issues or problems which did not previously exist may be exposed. As a result, new solutions for addressing these issues will be required.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
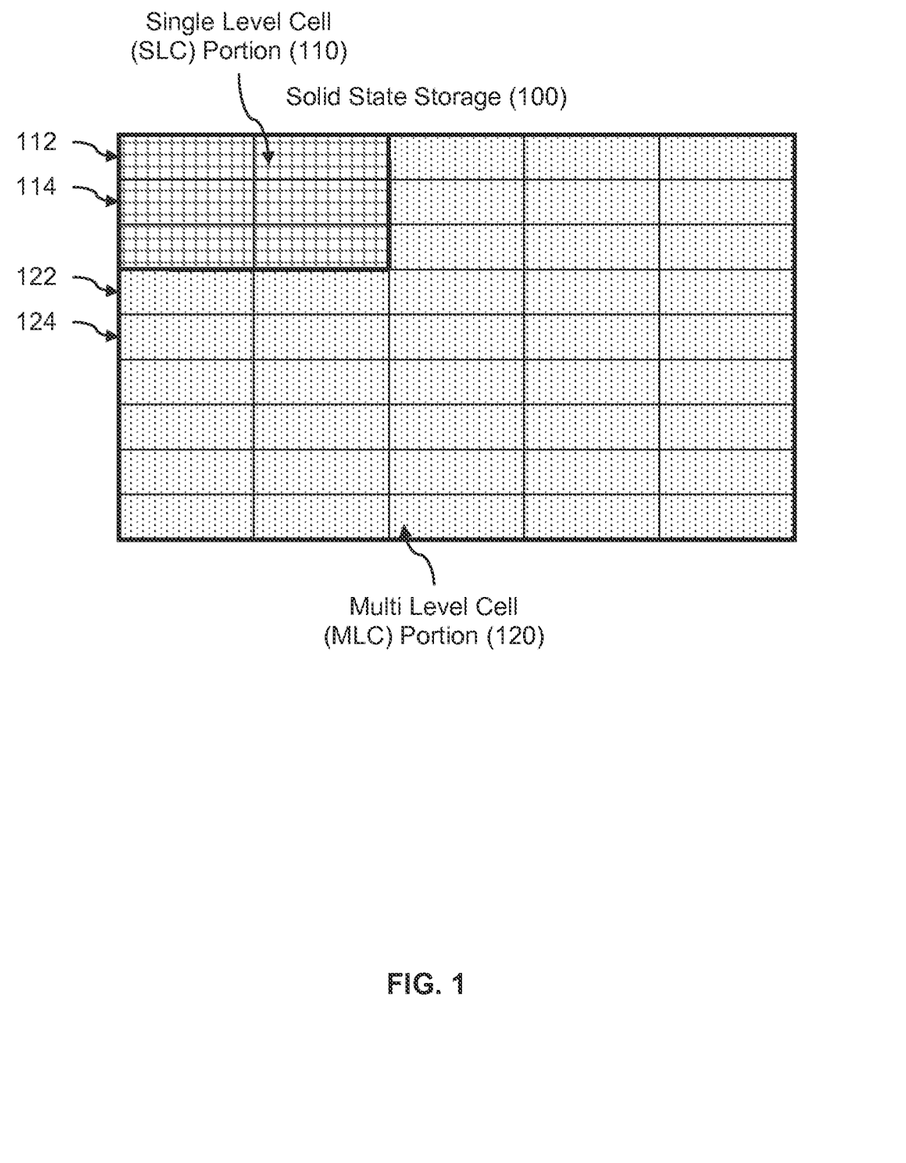
FIG. 1 is a diagram illustrating an embodiment of solid state storage which includes a single-level cell (SLC) portion and a multi-level cell (MLC) portion.

FIG. 1 is a diagram illustrating an embodiment of solid state storage which includes a single-level cell (SLC) portion and a multi-level cell (MLC) portion. In the example shown, solid state storage 100 includes two portions: SLC portion 110 where each cell stores a single bit and MLC portion 120 where each cell stores 2 bits. In this particular example, SLC portion 110 includes 6 blocks and MLC portion 120 includes 39 blocks.

To improve upon the performance of previous solid state storage systems, new systems (such as this one) keep multiple blocks open to which data is written. An open block may be referred to more generally as an open group of locations. In this particular example, there is an open SLC block to which data is written, as well as an open MLC block to which data is written.

Each of the blocks shown in SLC portion 110 and MLC portion 120 are classified as closed, open, or erased. Initially, all blocks are in an erased state. SLC block 112 and MLC block 122 are opened for writing and are thus classified as open. Using a technique which is described in further detail below, write data (e.g., from a host) is assigned to either a currently open SLC block or a currently open MLC block. When an open block gets full, it is closed and a new block of the same type is opened. For example, when SLC block 112 gets full with written data, it is closed and SLC block 114 is opened. Similarly, MLC block 122 is closed when it gets full and MLC block 124 is opened. At any given moment, there is at most one open block of a given type (e.g., SLC or MLC) for host writes. In some embodiments, a block may be open for some other purpose, such as for garbage collection writes. For simplicity, examples described herein will only discuss blocks open for host writes but the technique applies to blocks open for any purpose.

Although the system shown in FIG. 1 offers improvements over previous systems, new issues have arisen. As will be discussed in further detail below, the following write process may be used so that the system is able to rebuild a logical block address (LBA) table in the event of an unexpected loss of power.

Figure 2:
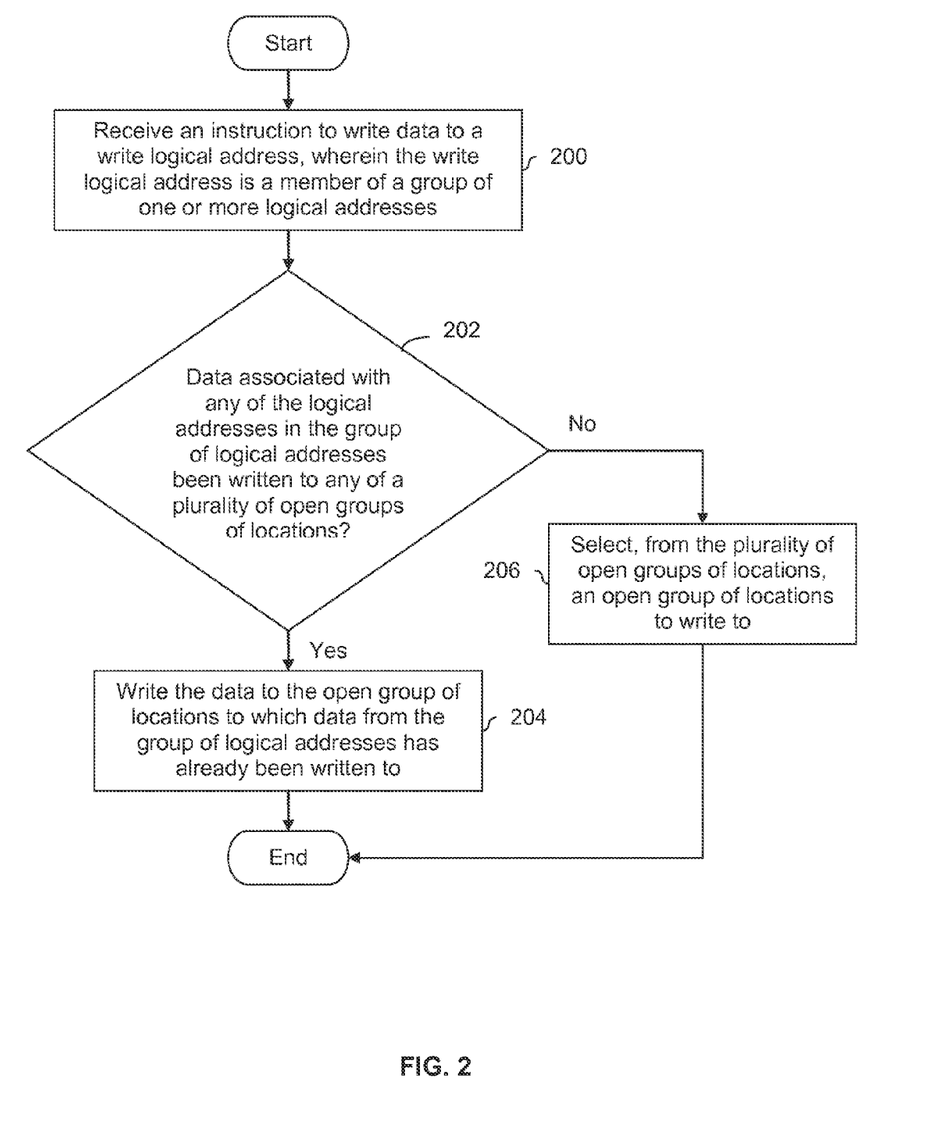
FIG. 2 is a flowchart illustrating an embodiment of a process for writing data when there are multiple open groups of locations.

FIG. 2 is a flowchart illustrating an embodiment of a process for writing data when there are multiple open groups of locations. In some embodiments, the process is performed by a write processor which is implemented using a semiconductor device, such as an application-specific integrated circuit (ASIC) or a field-programmable gate array (FPGA). In some embodiments, the multiple open groups of locations are located on solid state storage which spans one or more semiconductor devices.

At 200, an instruction to write data to a write logical address is received, wherein the write logical address is a member of a group of one or more logical addresses. For example, the instruction may be issued by a host and received by a write processor which is part of a storage controller.

At 202, it is determined if data associated with any of the logical addresses in the group of logical addresses has been written to any of a plurality of open groups of locations. In FIG. 1, for example, the system has an open SLC block and an open MLC block. The following figure shows some examples of the decision at step 202.

Figure 3:
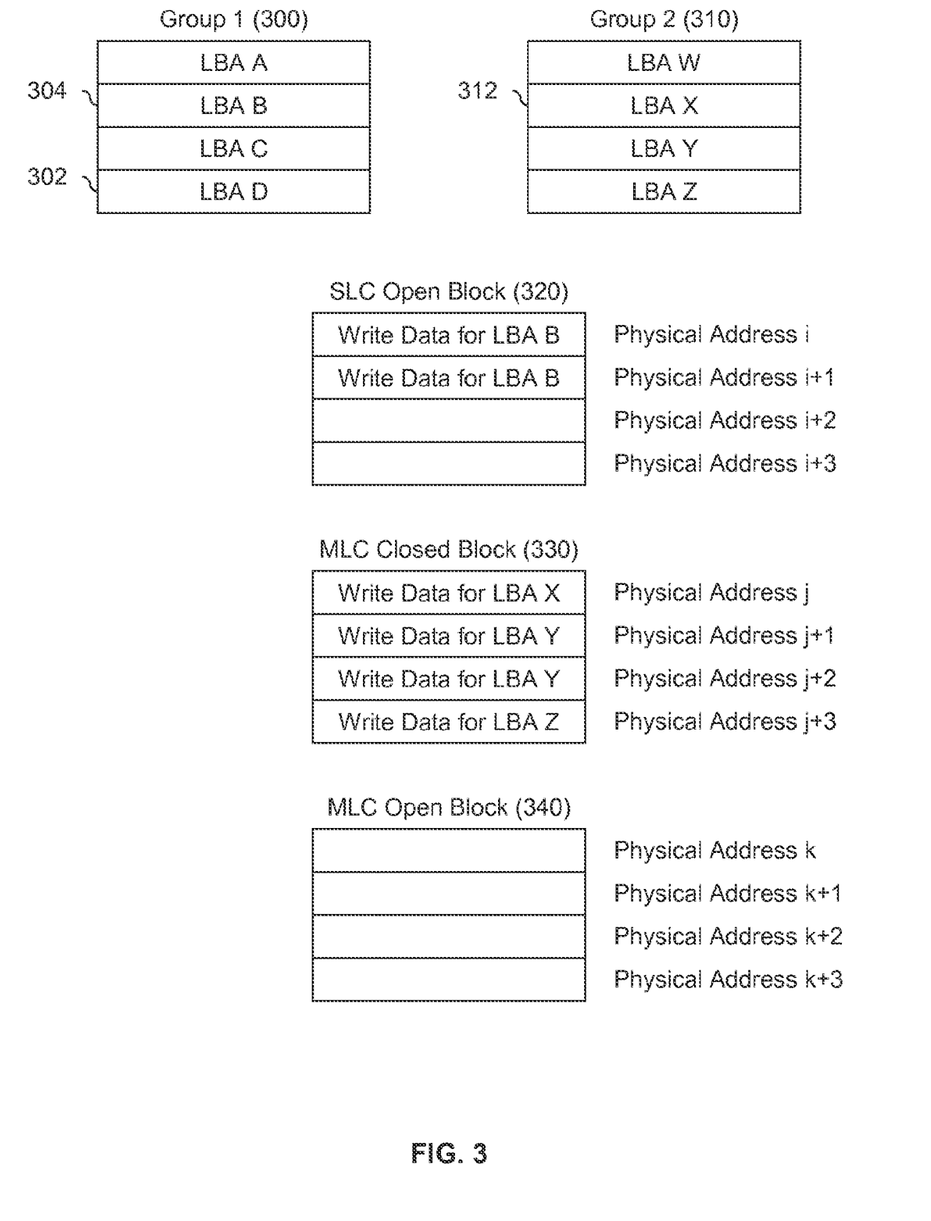
FIG. 3 is a diagram illustrating an embodiment of groups of logical block addresses and open blocks.

FIG. 3 is a diagram illustrating an embodiment of groups of logical block addresses and open blocks. In the example shown, group 1 (300) and group 2 (310) are examples of groups of one or more logical addresses referred to in FIG. 2. Group 1 (300) includes logical block addresses A-D and group 2 (310) includes logical block addresses W-Z. SLC open block 320 includes physical addresses i–(i+3), MLC closed block 330 includes physical addresses j–(j+3), and MLC open block 340 includes physical addresses k–(k+3).

SLC open block 320 is an example of an open group of locations; MLC open block 340 is another example of an open group of locations. In this example, SLC open block 320 includes write data associated with logical block address B (304), which is a member of group 1 (300). MLC open block 340 is empty. MLC block 330 has been filled with write data and has been closed. As described above, at any given time there is at most one SLC open block and at most one MLC open block.

In one example of step 202 in FIG. 2, a write instruction is received from a host for logical block address D (302). Logical block address D is a member of group 1 (300), so it is determined if any data associated with any of the logical block addresses in group 1 (300) (i.e., logical block address A, logical block address B, logical block address C, or logical block address D) has been written to any of the open groups of locations (i.e., SLC open block 320 or MLC open block 340). Data associated with logical block address B (304) has already been written to SLC open block 320, so the decision at step 202 in FIG. 2 would be "Yes."

In another example of step 202 in FIG. 2, a write instruction is received from a host for logical block address X (312). Logical block address X (312) is a member of group 2 (310), so it is determined if any data associated with any of the logical block addresses in group 2 (310) (i.e., logical block address W, logical block address X, logical block address Y, or logical block address Z) has been written to SLC open block 320 or MLC open block 340. SLC open block 320 contains data from group 1 (300) but no data from group 2 (310) and MLC open block 340 is empty, so the decision at step 202 in FIG. 2 is "No." It is noted that although data from group 2 (310) has been written to MLC closed block 330, that block is closed and the decision at step 202 is interested in open blocks, not closed blocks, so the decision at step 202 is "No" in this example.

Returning to FIG. 2, if the decision at step 202 is "Yes," then at 204 the data is written to the open group of locations to which data from the group of logical addresses has already been written to. For example, in FIG. 3, data associated with logical block address D (302) would be written to SLC open block 320 to join the data associated with logical block address B (304).

If the decision at step 202 in FIG. 2 is "No," then at 206 an open group of locations to write to is selected from the plurality of open groups of locations. For example, in FIG. 3, either SLC open block 320 or MLC open block 340 would be selected for logical address X (312).

In FIG. 3, group 1 (300) may be conceptually thought of as being committed to SLC open block 320, at least so long as SLC open block 320 is open. Once SLC open block 320 is closed (i.e., because it is full), group 1 (300) may, if desired, switch to MLC open block (340). Alternatively, data from group 1 (300) may continue to be written to whatever SLC block is open at that time.

Similarly, once group 2 (320) selects either SLC open block 320 or MLC open block 340, group 2 (320) is committed to that open block until that block is closed. Once that block is closed, group 2 (320) may, if desired, change the type of block (i.e., SLC or MLC) to which data from that group is written to.

It is noted that although FIGS. 1 and 3 show SLC and MLC portions and blocks, the process of FIG. 2 does not require its open blocks to have different storage capacities (e.g., 1 bit per cell versus 2 bits per cell). For example, the plurality of open groups of locations may comprise multiple open blocks of SLC (MLC) storage.

A benefit to using the write process of FIG. 2 is that in the event of a sudden power-off, the system is able to rebuild an LBA table which is stored in volatile memory. An LBA table contains the mapping between logical block addresses and physical addresses. In the solid state storage itself, a portion of the solid state storage is allocated for bookkeeping or other overhead information. In this bookkeeping space, the LBA table is kept. Changes to the LBA table are periodically (but not immediately) sent from the storage controller (e.g., one semiconductor chip) to the solid state storage (e.g., one or more other semiconductor chips) so the LBA table on the non-volatile solid state storage is not always up to date. To obtain the last few changes to the LBA table after an unexpected loss of power, a sudden power-off recovery (SPOR) process goes through the open blocks and any needed closed blocks for which an update was not sent to solid state storage. Processing the information from the closed blocks is relatively straightforward since the storage controller generates a summary which is stored within each closed block when that block is closed. However, each open block must be processed entry-by-entry by the SPOR process. If data for a given logical address is in multiple open blocks, the SPOR process will not know which entry for that given logical address is the most recent one. To put it another way, the SPOR process will not know what physical address to map a logical address to because there are two (or more) possibilities.

The write process of FIG. 2 ensures that data for each logical address is contained within at most one open block. Since writes occur sequentially within a given open block, the SPOR process will know what physical address to map a logical address to even if there are two entries for the same logical address in a single open block. For example, in FIG. 3, there are two entries for logical block address B in SLC open block 320. However, since the writes occur sequentially within a given open block, the SPOR process will know when rebuilding the LBA table that logical block address B should be mapped to physical address i+1, and not physical address i.

In various embodiments, a variety of techniques may be used to determine or track what group of open locations data from a given group of logical addresses has been written to. The following figures show some embodiments where a destination table is used.

Figure 4:
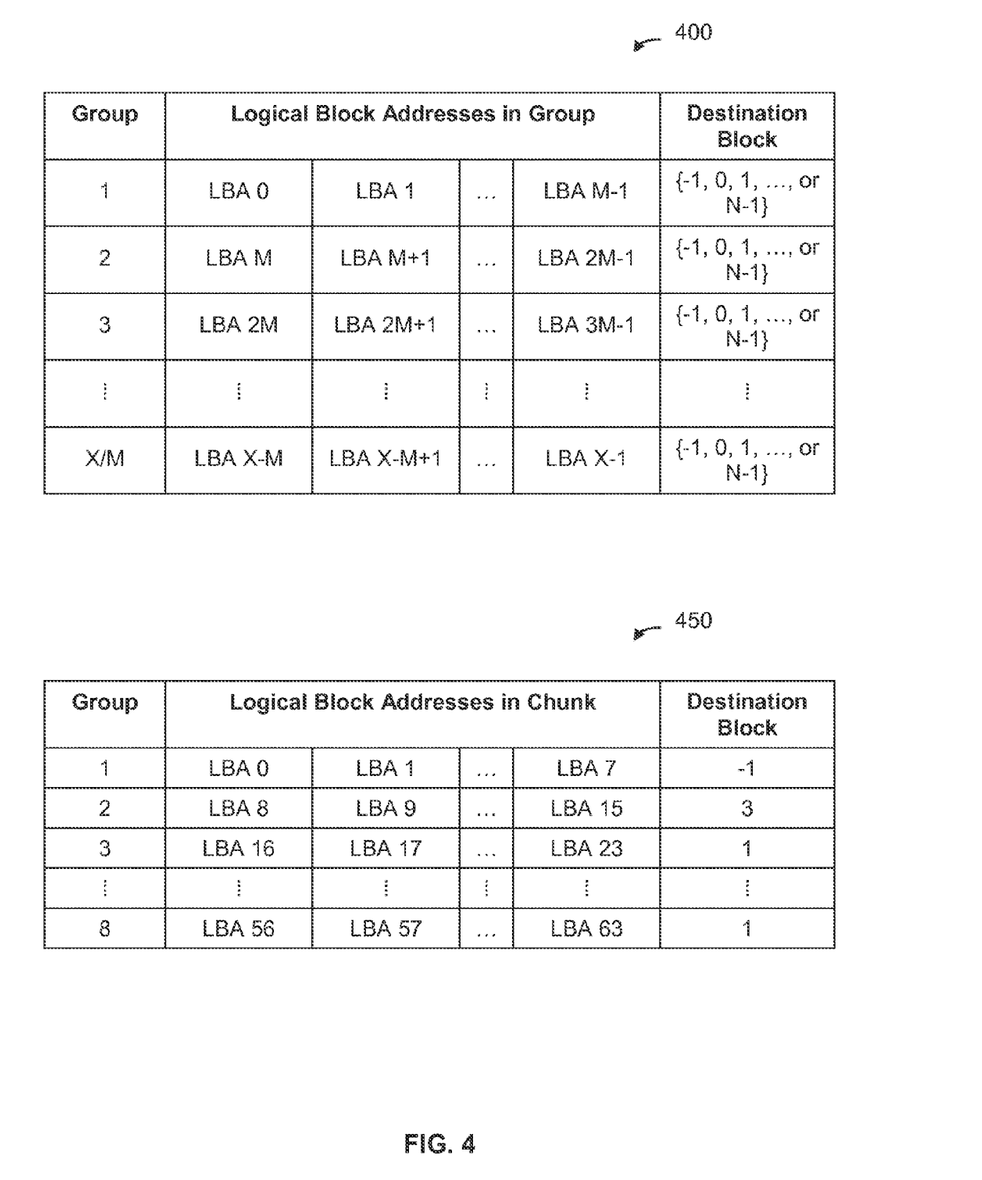
FIG. 4 is a diagram illustrating some embodiments of a destination table.

FIG. 4 is a diagram illustrating some embodiments of a destination table. In the example shown, diagram 400 shows a generic destination table where each group of logical block addresses includes M logical block addresses. For example, in diagram 450, M=8. There are X total logical block addresses, so there are X/M groups of logical block addresses. In diagram 450, for example, X=64 such that X/M=64/8=8.

The destination block column is used to track which open block, if any, each group of logical block addresses has been written to. In this example, there are N possibilities. For example, in FIG. 3, N=2 because there is an SLC open block and an MLC open block. The value of −1 is reserved for the case when data from a group has not yet been written to any of the open blocks. For example, in FIG. 3, group 2 (310) would have destination=−1 because no data from that group has been written to either SLC open block 320 or MLC open block 340. Once group 2 (310) has been written to one of the open blocks, the destination block value would be updated for group 2 (310), for example to destination block=0 (e.g., if the SLC open block has been written to) or destination block=1 (e.g., if the MLC open block has been written to). Similarly, the destination for group 1 (300) would be updated to −1 once SLC open block 320 is closed but before data from group 1 (300) is written to an open block.

Diagram 450 shows a filled-in example where M=8, X=64, and N=4. In this example, group 1 has not yet been written to any of the open blocks and so destination block=−1. Group 2 has some data associated with it stored in the open block corresponding to destination block=3. Groups 3 and 8 have some data associated with those groups stored in the open block corresponding to destination block=1. As is shown in this example, multiple groups of logical block addresses may be written to the same open block. Note that when the open block corresponding to destination block=1 is eventually closed, both the entry for group 3 and for group 8 will be updated so that the destination block column is set to −1. At that time, both groups will be able to pick a new open block (e.g., the same open block as before or different open blocks).

It is noted that the destination table examples shown herein do not track the actual physical addresses that correspond to a given open block. This may be desirable for a variety of reasons. For one, physical addresses tend to be very long, so more bits would have to be allocated to the destination column.

Figure 5:
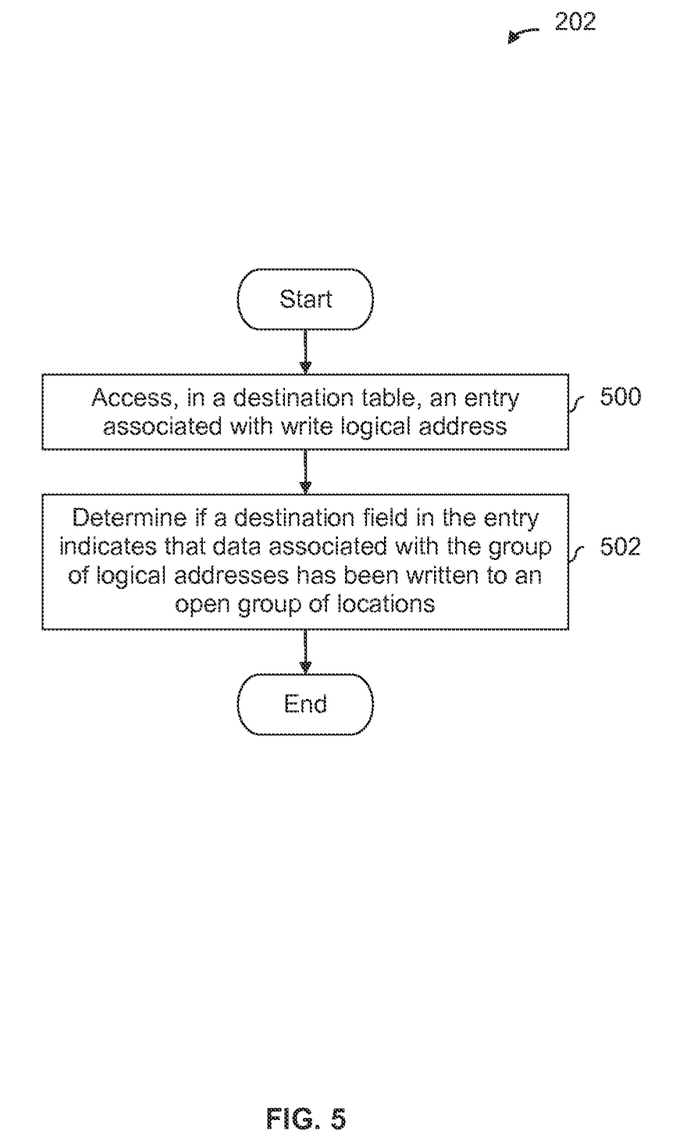
FIG. 5 is a flowchart illustrating an embodiment of a process for using a destination table to determine if data from a group of logical addresses has been written to an open group of locations.

FIG. 5 is a flowchart illustrating an embodiment of a process for using a destination table to determine if data from a group of logical addresses has been written to an open group of locations. In some embodiments, the process is used at step 202 in FIG. 2.

At 500, an entry associated with the write logical address is accessed in a destination table. Using the destination table format shown in FIG. 4 as an example, since the value of M is known, the equation $$\left\lfloor \frac{\text{write logical address}}{M} \right\rfloor + 1$$

gives the corresponding group/entry in the destination table.

At 502, it is determined if a destination field in the entry indicates that data associated with the group of logical addresses has been written to an open group of locations. For example, if destination block=−1 for that entry, then no data from that group has been written to any of the open groups of locations and the decision at step 202 in FIG. 2 would be "No." In FIG. 3, destination block=−1 for group 2 (310) since no data from that group has been written to either SLC open block 320 or MLC open block 340 and MLC closed block 330 does not count because it is not open.

If the destination field has a value in the range of 0–(N−1), then the value indicates what open group of locations data from that group of logical addresses has been written to. In FIG. 3, for example, the destination field for group 1 (300) would correspond to SLC open block 320. In step 202 of FIG. 2, this corresponds to a "Yes" decision.

Figure 6:
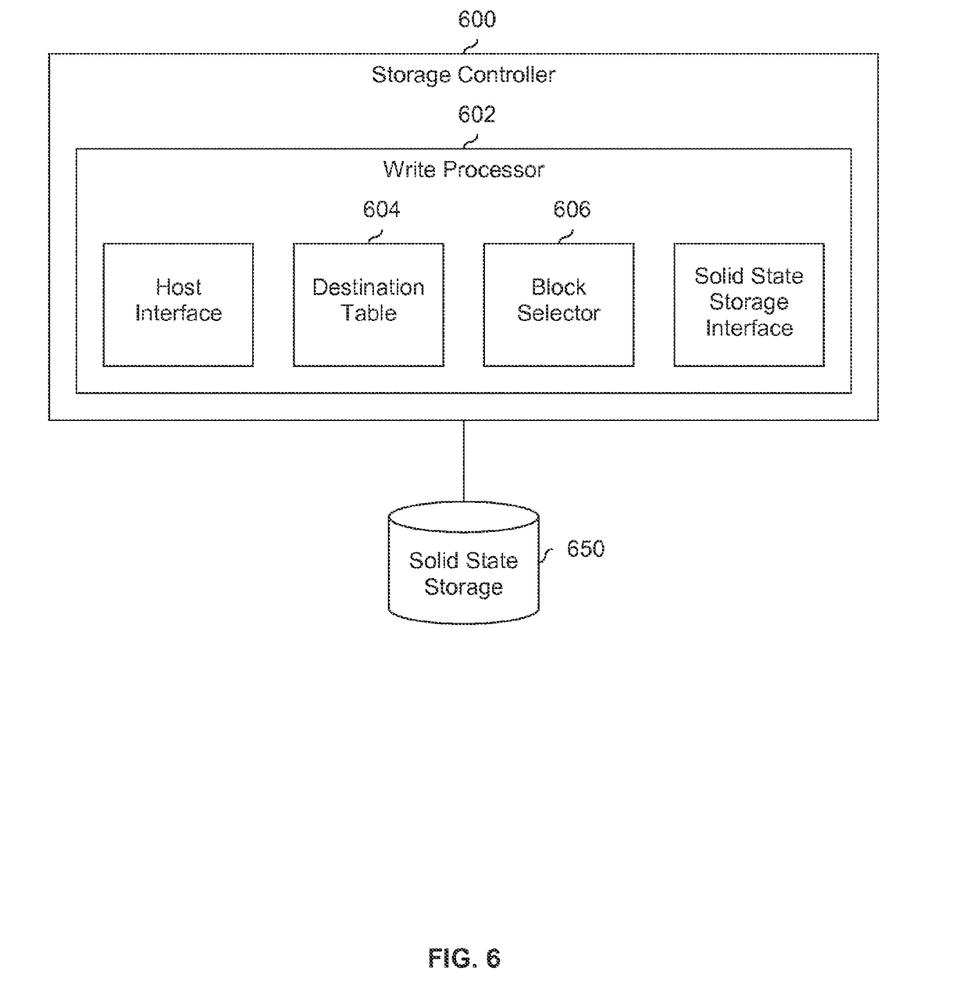
FIG. 6 is a diagram illustrating an embodiment of a write processor which includes a destination table.

FIG. 6 is a diagram illustrating an embodiment of a write processor which includes a destination table. In the example shown, write processor 602 performs the process shown in FIG. 5. In this example, write processor 602 is part of storage controller 600. In some embodiments, storage controller 600 comprises one semiconductor chip and solid state storage 650 comprises one or more other semiconductor chips.

In the example shown, write processor 602 includes destination table 604 and block selector 606. FIG. 4 shows some examples of destination table 604. Block selector 606 accesses destination table 604 and accesses an entry associated with the write logical address. For example, if the write LBA is 14 and the destination table is as shown in diagram 450 in FIG. 4, then entry 2 would be accessed.

Block selector 606 then accesses the destination field to determine if data associated with the group of logical addresses has been written to an open group of locations. To use the destination table in diagram 450 in FIG. 4 as an example, for a write LBA of 14, destination block=3, so the open block corresponding to destination block=3 is selected for the data to be written to. In contrast, if the write LBA=1, then group/entry 1 would be accessed from the destination table in diagram 450. For group/entry 1, the destination block field=−1. This means that no data from that group has been written to a currently open block, so block selector 606 is permitted to select any open block using any appropriate technique.

In some embodiments, some other technique besides a destination table is used to track what open group of locations (if any) data from a given group of logical addresses has been written to. The following figures describe some embodiments in which a LBA table is used.

Figure 7:
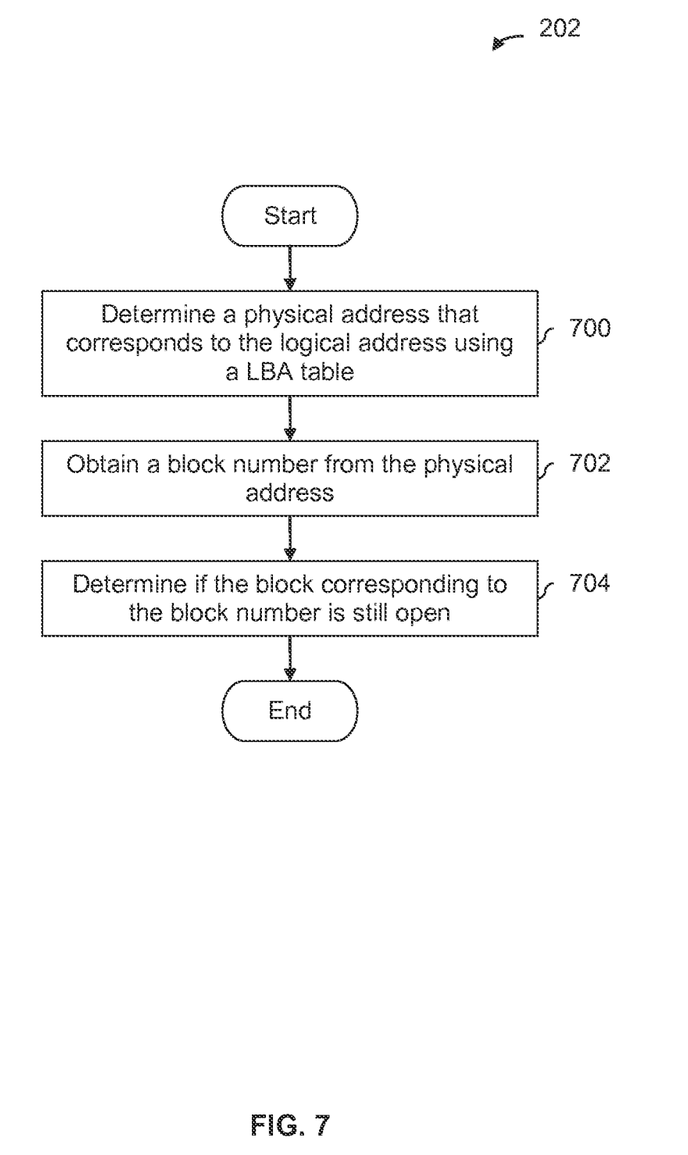
FIG. 7 is a flowchart illustrating an embodiment of a process for using a LBA table to determine if data from a group of logical addresses has been written to an open group of locations.

FIG. 7 is a flowchart illustrating an embodiment of a process for using a LBA table to determine if data from a group of logical addresses has been written to an open group of locations. In some embodiments, the process is used at step 202 in FIG. 2.

At 700, a physical address that corresponds to the logical address is determined using a LBA table. This LBA table may be the same one that the write process of FIG. 2 enables rebuilding of (e.g., following an unexpected loss of power).

At 702, a block number is obtained from the physical address. For example, the physical address may comprise {Channel Number, Die Number, Block Number, Page Number} and the block number is extracted from the appropriate part of the physical address.

At 704, it is determine if the block corresponding to the block number is still open. For example, if the block is closed, then the decision at step 202 in FIG. 2 would be "No" and a new open group is selected at step 206. If the block is still open, then the decision at step 202 in FIG. 2 would be "Yes" and the data would be written to the still-open block at step 204.

Figure 8:
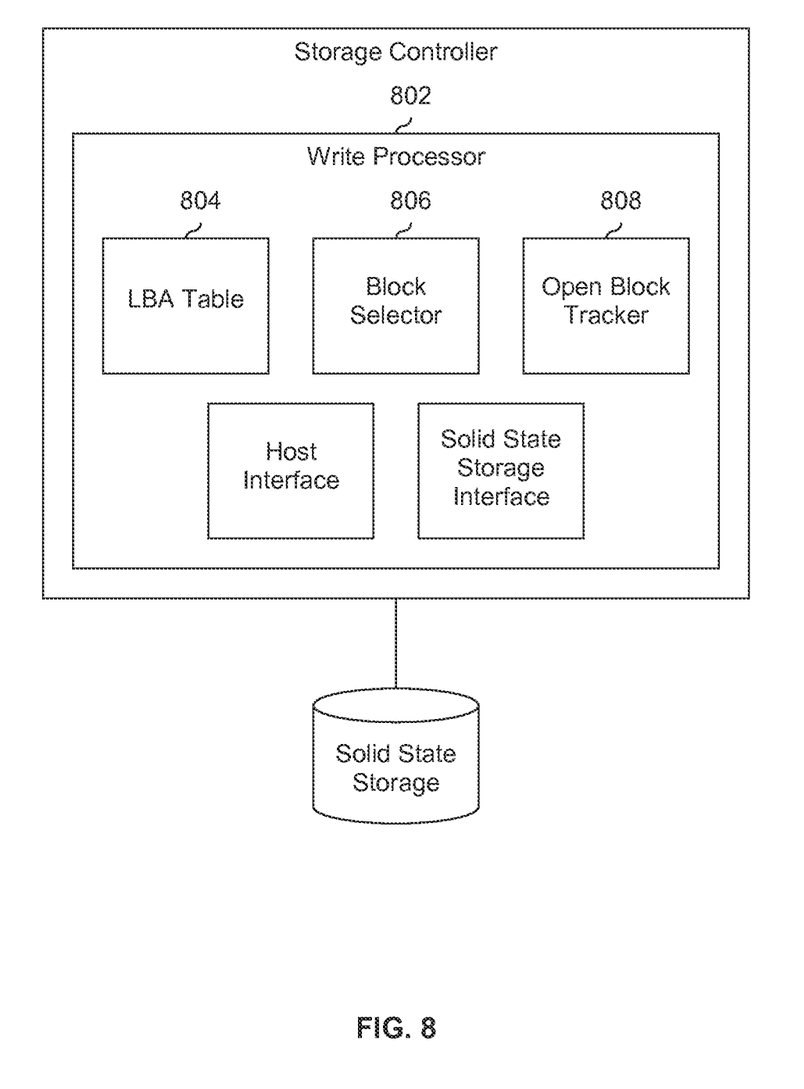
FIG. 8 is a diagram illustrating an embodiment of a write processor which includes a LBA table.

FIG. 8 is a diagram illustrating an embodiment of a write processor which includes a LBA table. In the example shown, write processor 802 performs the process shown in FIG. 7. Block selector 806 accesses LBA table 804 to determine the physical address that corresponds to the logical address (e.g., received from a host). LBA table 804 returns the physical address to block selector 806 which then extracts the block number from the physical address. That block number is passed from block selector 806 to open block tracker 808, which tracks the currently open blocks. If the specified block number is still open, then that block is selected by block selector 806 for data to be written to. If that block is not currently open, then block selector 806 may use any appropriate technique to select an open block to write to.

In some applications, using an LBA table to perform the process shown in FIG. 2 may be preferable to using a destination table. An LBA table may already exist in a storage controller, so additional memory and/or processing is not required to create an LBA table. In contrast, a destination table may be a new thing and new memory and/or processing resources may need to be allocated to create a destination table.

As described above, if it is determined at step 202 in FIG. 2 that no data associated with any of the logical addresses in the group of logical addresses has been written to any of the open groups of locations, then any appropriate selection technique may be used at step 206. In some embodiments, a traffic-based selection technique is used. The following figures describe some examples.

Figure 9:
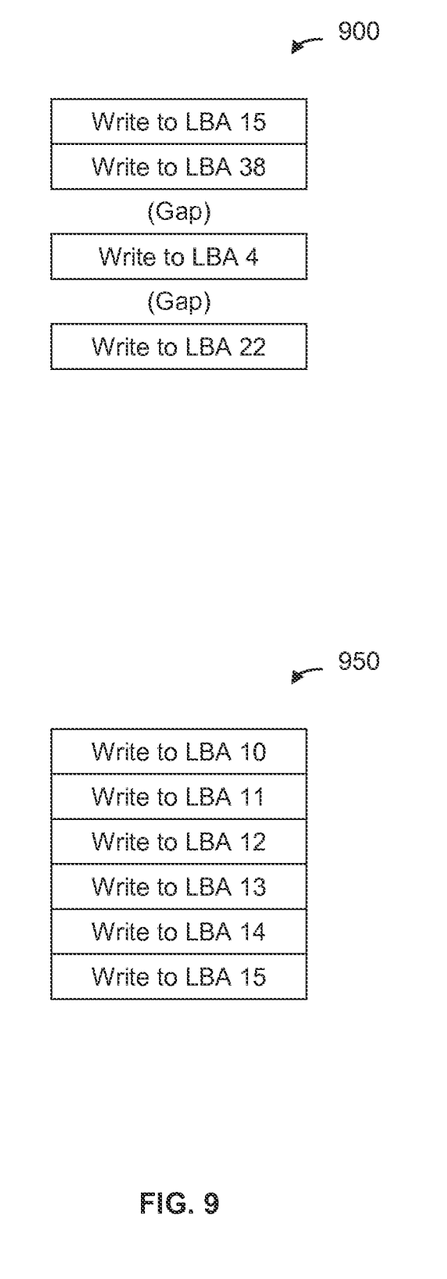
FIG. 9 is a diagram illustrating an embodiment of different traffic patterns which are assigned to different open blocks when a block selector is free to select a (new) open block.

FIG. 9 is a diagram illustrating an embodiment of different traffic patterns which are assigned to different open blocks when a block selector is free to select a (new) open block. In the example shown, traffic pattern 900 shows a sequence of write instructions associated with short, random writes. In the example shown, the logical block addresses being written to (i.e., logical block addresses 15, 38, 4, and 22) are not sequential. There is also a gap of time between the write instructions to LBA 38 and LBA 4, as well as between the write instructions to LBA 4 and LBA 22. In some embodiments, one or both of these characteristics (i.e., gaps of time between write instructions and/or non-sequential logical addresses) are indicative of short, random writes. In some embodiments, short, random writes are written to an SLC open block when a (new) open block needs to be selected (e.g., at step 206 in FIG. 2).

Traffic pattern 950 is an example of a long, sequential write. In that example there are no gaps between the write instructions and the logical block addresses being written to (i.e., logical block addresses 10-15) are sequential. In some embodiments, long, sequential writes are written to an MLC open block.

In some embodiments, a block selector (e.g., block selector 606 in FIG. 6 or block selector 806 in FIG. 8) is configured to ingest write instructions received from a host, characterizes the ingested write instructions (e.g., toggling between a "long, sequential writes" state and a "short, random writes" state depending upon the current traffic pattern), and assigns the corresponding write data to an appropriate open block (e.g., short, random writes to an SLC open block and long, sequential writes to an MLC open block).

Although in the example above a block selector (e.g., in a write processor) is described as performing the traffic classification, in some embodiments, a host provides or otherwise specifies the traffic classification. For example, when a write instruction is passed from a host to a write processor, the write instruction may include a traffic type or classification (e.g., traffic type="long, sequential write" or traffic type="short, random write"). The write processor may used this traffic classification to select (if needed) a (new) open block to write to. This, for example, permits the host (or an application running on the host) to have control over what open block its data is written to and (if desired) change such an association or link on-the-fly.

In some embodiments, a host-provided traffic classification is optional. For example, some applications may not have the ability to classify what kind of traffic is being written at any given time whereas other applications do have that ability. In some embodiments, if a host provides a traffic classification, then that information is used to select (if needed) a (new) open block to write to. If traffic classification information is not specified by the host, then the write processor performs the classification by analyzing the write instructions. This permits the system to operate with a variety of applications or hosts having a variety of capabilities.

In some other embodiments, some other traffic characteristic or traffic type is used to select a (new) open block when needed. For example, the "temperature" of data may be used to assign data to an appropriate open block. Hot data is data that will be (or is expected to be) invalidated shortly in the future. Cold data is defined as data that will remain valid (or is expected to remain valid) for a long time in the future. In some embodiments, hot data is written to one open block and cold data is written to another open block. In some applications it is desirable to keep hot data with hot data and cold data with cold data, and so assigning them to different open blocks achieves this. As described above, a host may provide this classification, or the write process may analyze the write instructions in order to perform the classification. Also as described above, it is not necessary for different open blocks to have different storage capacities, so the hot data may be assigned to a first MLC open block (e.g., from a first group of blocks) and the cold data may be assigned to a second MLC open block (e.g., from a second, non-overlapping group of blocks).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a host interface configured to receive an instruction for writing write data to a write logical address, wherein the write logical address is a member of a first logical address group wherein the first logical address group is one of a plurality of logical address groups comprising a plurality of logical addresses;
   a block selector configured for selecting an open block from a plurality of open blocks for writing the write data, wherein each of the plurality of open blocks comprises a group of physical addresses having at least one of the physical addresses thereof valid for writing the write data, and wherein the selecting the open block includes:
      determining if any existing data, whose associated logical address is in the first logical address group, has been previously written to a first open block, wherein the first open block is one of the plurality of open blocks;

in the event it is determined that the any existing data whose associated logical address is in the first logical address group has been previously written to the first open block, selecting the first open block to which to write the write data;

in the event it is determined that the any existing data whose associated logical address is in the first logical address group has not been previously written to the first open block, selecting one of the plurality of open blocks to which to write the write data; and writing the write data to the selected open block.

2. The system recited in claim 1, further comprising solid state storage and a storage interface, wherein the storage interface is configured to write to the solid state storage.

3. The system recited in claim 1, wherein the system includes a semiconductor device, including one or more of the following: an application-specific integrated circuit (ASIC) or a field-programmable gate array (FPGA).

4. The system recited in claim 1, wherein the block selector is configured to determine, including by:

accessing, in a destination table, an entry associated with the write logical address; and determining if a destination field in the entry indicates that data associated with the group of logical addresses has been previously written to the first open block.

5. The system recited in claim 1, wherein the block selector is configured to determine, including by:

determining a physical address that corresponds to the logical address using a LBA table;

obtaining a block number from the physical address; and determining if the block corresponding to the block number is still open.

6. The system recited in claim 1, wherein the block selector is configured to select based at least in part on a traffic classification.

7. The system recited in claim 6, wherein a single-level cell (SLC) open block is selected in the event the traffic classification is associated with a short, random write and a multi-level cell (MLC) open block is selected in the event the traffic classification is associated with a long, sequential write.

8. The system recited in claim 6, wherein an open block from a first group of blocks is selected in the event the traffic classification is associated with hot data and an open block from a second group of blocks is selected in the event the traffic classification is associated with cold data.

9. The system recited in claim 6, wherein the traffic classification is provided by a host.

10. The system recited in claim 6, wherein the block selector is further configured to generate the traffic classification.

11. A method, comprising:

receiving an instruction for writing write data to a write logical address, wherein the write logical address is a member of a first logical address group, wherein the first logical address group is one of a plurality of logical address groups comprising a plurality of logical addresses;

using a processor to determine if any existing data, whose associated logical address is in the first logical address group, has been previously written to a first open block, wherein the first open block is one of a plurality of open blocks, each of the plurality of open blocks comprises a group of physical addresses having at least one of the physical addresses thereof valid for writing the write data;

in the event it is determined that the any existing data whose associated logical address is in the first logical address group has been previously written to the first open block, selecting the first open block to which to write the write data;

in the event it is determined that the any existing data whose associated logical address is in the first logical address group has not been previously written to the first open block, selecting one of the plurality of open blocks to which to write the write data; and writing the write data to the selected open block.

12. The method recited in claim 11, wherein the method is performed by a semiconductor device, including one or more of the following: an application-specific integrated circuit (ASIC) or a field-programmable gate array (FPGA).

13. The method recited in claim 11, wherein using a processor to determine includes:

accessing, in a destination table, an entry associated with the write logical address; and determining if a destination field in the entry indicates that data associated with the group of logical addresses has been previously written to the first open block.

14. The method recited in claim 11, wherein using a processor to determine includes:

determining a physical address that corresponds to the logical address using a LBA table;

obtaining a block number from the physical address; and determining if the block corresponding to the block number is still open.

15. The method recited in claim 11, wherein selecting is based at least in part on a traffic classification.

16. The method recited in claim 15, wherein a single-level cell (SLC) open block is selected in the event the traffic classification is associated with a short, random write and a multi-level cell (MLC) open block is selected in the event the traffic classification is associated with a long, sequential write.

17. The method recited in claim 15, wherein an open block from a first group of blocks is selected in the event the traffic classification is associated with hot data and an open block from a second group of blocks is selected in the event the traffic classification is associated with cold data.

18. The method recited in claim 15, wherein the traffic classification is provided by a host.

19. A computer program product, the computer program product being embodied in a non-transitory computer readable storage medium and comprising computer instructions for:

receiving an instruction for writing write data to a write logical address, wherein the write logical address is a member of a first logical address group, wherein the first logical address group is one of a plurality of logical address groups comprising a plurality of logical addresses;

determining if any existing data, whose associated logical address is in the first logical address group, has been previously written to a first open block, wherein the first open block is one of a plurality of open blocks, each of the plurality of open blocks comprises a group of physical addresses having at least one of the physical addresses thereof valid for writing the write data;

in the event it is determined that the any existing data whose associated logical address is in the first logical address group has been previously written to the first open block, selecting the first open block to which to write the write data;

in the event it is determined that the any existing data whose associated logical address is in the first logical address group has not been previously written to the first open block, selecting one of the plurality of open blocks to which to write the write data; and writing the write data to the selected open block.

* * * * *